(12) United States Patent
Stefani et al.

(10) Patent No.: US 11,494,339 B2
(45) Date of Patent: *Nov. 8, 2022

(54) MULTI-LEVEL COMPRESSION FOR STORING DATA IN A DATA STORE

(71) Applicant: Amazon Technologies, Inc., Seattle, WA (US)

(72) Inventors: Stefano Stefani, Issaquah, WA (US); Anurag Windlass Gupta, Atherton, CA (US)

(73) Assignee: Amazon Tehnologies, Inc., Seattle, WA (US)

( * ) Notice: Subject to any disclaimer, the term of this patent is extended or adjusted under 35 U.S.C. 154(b) by 70 days.

This patent is subject to a terminal disclaimer.

(21) Appl. No.: 16/029,430

(22) Filed: Jul. 6, 2018

(65) Prior Publication Data

US 2018/0314712 A1 Nov. 1, 2018

Related U.S. Application Data

(63) Continuation of application No. 13/747,169, filed on Jan. 22, 2013, now Pat. No. 10,019,457.

(51) Int. Cl.
| | |
|---|---|
| *G06F 16/174* | (2019.01) |
| *H03M 7/30* | (2006.01) |
| *G06F 16/22* | (2019.01) |

(52) U.S. Cl.
CPC ........ *G06F 16/1744* (2019.01); *G06F 16/221* (2019.01); *H03M 7/30* (2013.01); *H03M 7/3059* (2013.01); *H03M 7/6076* (2013.01)

(58) Field of Classification Search
None
See application file for complete search history.

(56) References Cited

U.S. PATENT DOCUMENTS

| | | |
|---|---|---|
| 6,195,024 B1 | 2/2001 | Fallon |
| 6,236,341 B1 | 5/2001 | Dorward et al. |

(Continued)

FOREIGN PATENT DOCUMENTS

| | | |
|---|---|---|
| CN | 102594360 A | 7/2021 |
| EP | 1393517 | 3/2004 |

(Continued)

OTHER PUBLICATIONS

ACM, Dominik Slezak, Jakub Wroblewski, Victoria Eastwood, Piotr Synak, Brighthouse: An Analytic data Warehouse for Ad-hoc Queries, Aug. 2008, pp. 1337-1345, Proceedings of the VLDB Endowment vol. 1 Issue 2.

(Continued)

*Primary Examiner* — Giuseppi Giuliani
(74) *Attorney, Agent, or Firm* — Robert C. Kowert; Kowert, Hood, Munyon, Rankin & Goetzel. P.C.

(57) ABSTRACT

Data to be stored in a data block for a columnar database table may be compressed according to a multi-level compression scheme. Data to be stored in the data block may be received. The data may be compressed according a column-specific compression technique to produce compressed data. The compressed data may then be compressed according to a second compression technique different than the column-specific compression technique to produce multi-level compressed data. The multi-level compressed data may be stored in the data block. When reading from the data block, multi-level compressed data may be decompressed according to the column-specific compression technique and the default compression technique applied to the data.

20 Claims, 8 Drawing Sheets

(56) References Cited

U.S. PATENT DOCUMENTS

| | | |
|---|---|---|
| 6,778,291 B1 | 8/2004 | Clouthier |
| 6,779,040 B1 | 8/2004 | Lee et al. |
| 7,024,414 B2 | 4/2006 | Sah et al. |
| 7,860,843 B2 | 12/2010 | Dodd et al. |
| 7,966,343 B2 | 6/2011 | Yang et al. |
| 8,327,026 B1 | 12/2012 | Tripathi et al. |
| 2003/0028509 A1 | 2/2003 | Sah et al. |
| 2004/0024662 A1 | 2/2004 | Gray et al. |
| 2006/0294125 A1 | 12/2006 | Deaven |
| 2008/0263074 A1 | 10/2008 | Bissett et al. |
| 2010/0030748 A1 | 2/2010 | Netz et al. |
| 2010/0074321 A1 | 3/2010 | Beaudreau |
| 2010/0278446 A1 | 11/2010 | Ganesh et al. |
| 2010/0281004 A1* | 11/2010 | Kapoor .............. G06F 16/902 707/693 |
| 2010/0281079 A1 | 11/2010 | Marwah et al. |
| 2011/0022812 A1 | 1/2011 | van der Linden et al. |
| 2011/0029569 A1 | 2/2011 | Ganesh et al. |
| 2011/0038287 A1 | 2/2011 | Agarwal et al. |
| 2011/0103703 A1 | 5/2011 | Karlov |
| 2011/0167173 A1 | 7/2011 | Bansal et al. |
| 2011/0173161 A1 | 7/2011 | de la Torre et al. |
| 2011/0199241 A1 | 8/2011 | Torii |
| 2011/0219020 A1 | 9/2011 | Dks et al. |
| 2011/0246621 A1 | 10/2011 | May et al. |
| 2011/0257819 A1 | 10/2011 | Chen et al. |
| 2011/0307521 A1 | 12/2011 | Slezak et al. |
| 2011/0320417 A1 | 12/2011 | Luo et al. |
| 2012/0017010 A1 | 1/2012 | Chauhan |
| 2012/0026288 A1 | 2/2012 | Tourapis et al. |
| 2012/0039534 A1 | 2/2012 | Malik et al. |
| 2012/0054225 A1 | 3/2012 | Marwah et al. |
| 2012/0089579 A1 | 4/2012 | Ranade et al. |
| 2012/0143913 A1 | 6/2012 | Beier et al. |
| 2012/0265737 A1 | 10/2012 | Potkonjak |
| 2012/0284239 A1 | 11/2012 | Agarwala et al. |
| 2013/0103655 A1 | 4/2013 | Fanghaenel et al. |
| 2013/0332484 A1* | 12/2013 | Gajic ..................... G06F 16/21 707/770 |

FOREIGN PATENT DOCUMENTS

| | | |
|---|---|---|
| EP | 2011129818 | 10/2011 |
| JP | 2004112497 | 4/2004 |
| JP | 2005-293224 | 10/2005 |
| JP | 2005288157 | 10/2005 |
| JP | 2008207593 | 9/2008 |
| JP | 2012039198 | 2/2012 |

OTHER PUBLICATIONS

ACM, Daniel Abadi, Samuel Madden, Nabil Hachem, ColumnStores vs. RowStores: How Different Are They Really?, Jun. 2008, pp. 967-980, Proceedings of the 2008 ACM SIGMOD International Conference on Management of Data.

Nicolas Bruno, Teaching an Old Elephant New Tricks, Jan. 2009, Proceedings of the Conference on Innovative Data Systems Research (CIDR) pp. 1-6.

Wilshire Conferences, William McKnight, Best Practices in the Use of Columnar Databases, Aug. 2011, available at http://www.wilshireconferences.com/NoSQL2011/WP/Calpont%20Whitepaper.pdf pp. 1-12.

U.S. Appl. No. 13/900,350, filed May 22, 2013, Anurag Windlass Gupta.

Huajian Mao, et al., "Wukong: A cloud-oriented file service for mobile Internet devices", Journal of Parallel and Distributed Computing, Elsevier, Oct. 31, 2011, pp. 171-184.

* cited by examiner

MULTI-LEVEL COMPRESSION FOR STORING DATA IN A DATA STORE This application is a continuation of U.S. patent application Ser. No. 13/747,169, filed Jan. 22, 2013, now U.S. patent Ser. No. 10/019,457, which is hereby incorporated by reference herein in its entirety.

BACKGROUND

As the technological capacity for organizations to create, track, and retain information continues to grow, a variety of different technologies for managing and storing the rising tide of information have been developed. Database systems, for example, provide clients with many different specialized or customized configurations of hardware and software to manage stored information. However, the increasing amounts of data organizations must store and manage often correspondingly increases both the size and complexity of data storage and management technologies, like database systems, which in turn escalate the cost of maintaining the information. New technologies more and more seek to reduce both the complexity and storage requirements of maintaining data while simultaneously improving the efficiency of data storage and data management.

Figure 1:
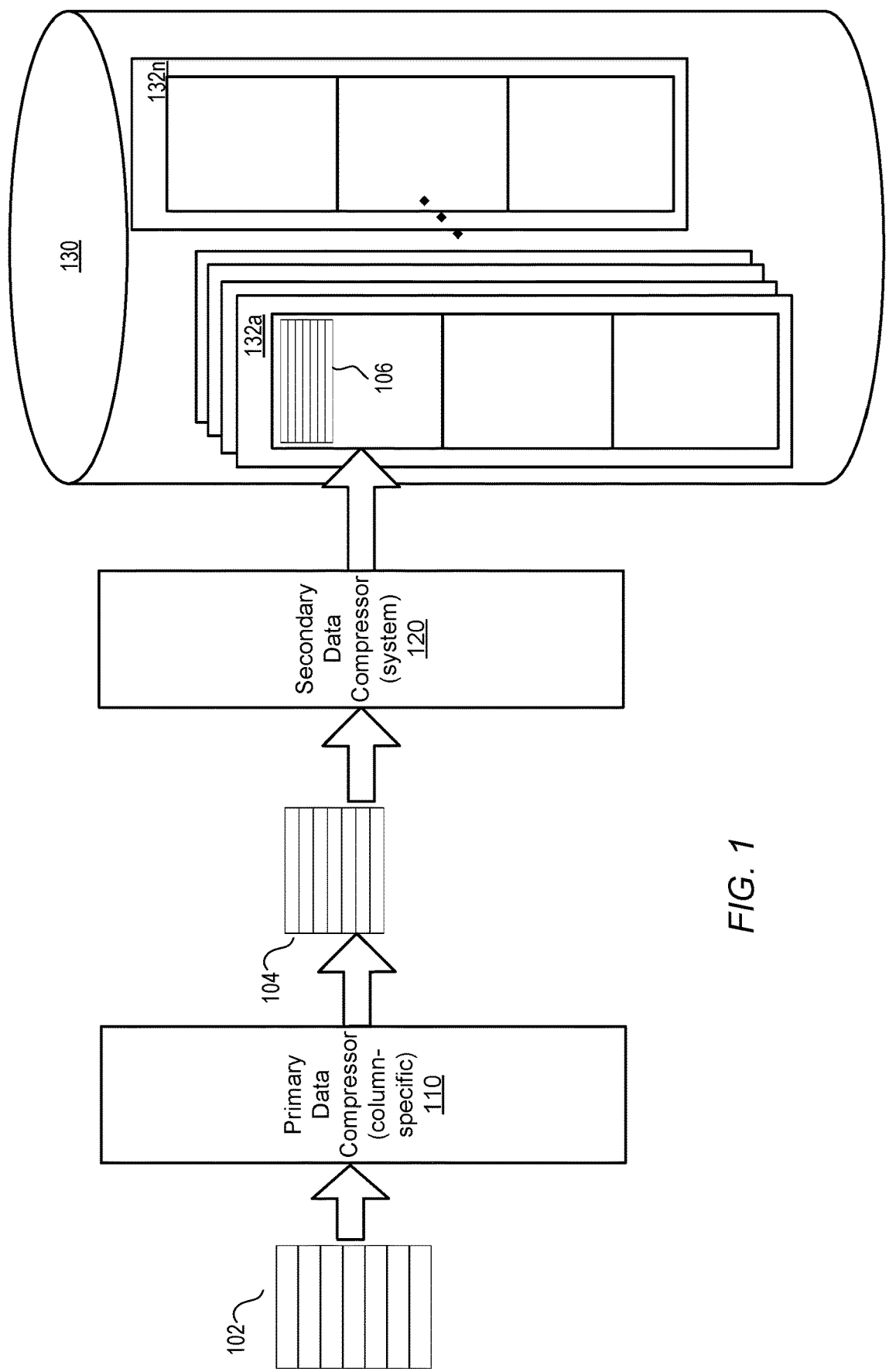
FIG. 1 illustrates a dataflow block diagram of a multi-level compression scheme for data to be stored in a data store, according to some embodiments.

While embodiments are described herein by way of example for several embodiments and illustrative drawings, those skilled in the art will recognize that embodiments are not limited to the embodiments or drawings described. It should be understood, that the drawings and detailed description thereto are not intended to limit embodiments to the particular form disclosed, but on the contrary, the intention is to cover all modifications, equivalents and alternatives falling within the spirit and scope as defined by the appended claims. The headings used herein are for organizational purposes only and are not meant to be used to limit the scope of the description or the claims. As used throughout this application, the word "may" is used in a permissive sense (i.e., meaning having the potential to), rather than the mandatory sense (i.e., meaning must). Similarly, the words "include," "including," and "includes" mean including, but not limited to.

DETAILED DESCRIPTION OF EMBODIMENTS

In the following detailed description, numerous specific details are set forth to provide a thorough understanding of claimed subject matter. However, it will be understood by those skilled in the art that claimed subject matter may be practiced without these specific details. In other instances, methods, apparatus, or systems that would be known by one of ordinary skill have not been described in detail so as not to obscure claimed subject matter.

It will also be understood that, although the terms first, second, etc. may be used herein to describe various elements, these elements should not be limited by these terms. These terms are only used to distinguish one element from another. For example, a first contact could be termed a second contact, and, similarly, a second contact could be termed a first contact, without departing from the scope of the present invention. The first contact and the second contact are both contacts, but they are not the same contact.

The terminology used in the description of the invention herein is for the purpose of describing particular embodiments only and is not intended to be limiting of the invention. As used in the description of the invention and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items. It will be further understood that the terms "includes," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof.

As used herein, the term "if" may be construed to mean "when" or "upon" or "in response to determining" or "in response to detecting," depending on the context. Similarly, the phrase "if it is determined" or "if [a stated condition or event] is detected" may be construed to mean "upon determining" or "in response to determining" or "upon detecting [the stated condition or event]" or "in response to detecting [the stated condition or event]," depending on the context.

Various embodiments of compressing data to be stored in a data store according to a multi-level compression scheme are described herein. A data store, such as a database management service (e.g., a distributed data warehouse system), or other data storage and/or management system may store data for various clients, entities, organizations, or individuals. The data store may be implemented using a variety of different configurations and schemes. For example, in some embodiments a data management system may implement column oriented database tables (hereinafter referred to as "columnar database tables") to provide efficient data management for clients.

The system or client may first apply one of a variety of different primary compression techniques (e.g., dictionary encoding, delta encoding, etc.) to data stored in a data block in the data store, such as a data block storing data for a column of a columnar database table. One of these compression techniques may be selected to be applied dependent on metadata describing a group of data blocks, such as the data blocks storing data for a column. The metadata may describe the distribution of the data stored in the group of data blocks or the type of data stored in the group of data blocks to be used for determining the compression technique to be applied. For example, if a group of data blocks storing data for a column represents date values, then delta encoding may be determined to encode the date values by storing the difference between one date and the next. Compressed data in the data block, however, may still leave space for further compression. A second compression technique, such as system (e.g., default) compression technique, may be applied to the already compressed data. The second compression technique may be a byte-oriented or otherwise data independent compression technique, such as a Lempel-Ziv derived compression technique, Huffman encoding, etc., to produce multi-level compressed data. This second compression technique may be informed by the compressed data that is to be compressed again. For example, data first compressed according to a primary compression technique, may then be compressed by a compression technique using only the first compressed data to determine and perform the second compression technique. When later servicing queries directed to the multi-level compressed data stored in the data store, less read operations (or other various access operations) may, for example, be executed to obtain data to service the query. By implementing a multi-level compression scheme in a data store, some embodiments may provide more efficient management of and access to large amounts of data.

It is not uncommon for clients (or customers, organizations, entities, etc.) to collect large amounts of data which may require subsequent storage or management. Although some clients may wish to implement their own data management system for this data, it is increasingly apparent that obtaining data management services may prove a more efficient and cost effective option for those clients who do not wish to manage their own data. For example, a small business may wish to maintain sales records and related data for future data analysis. Instead of investing directly in the data management system to maintain the data, and the expertise required to set up and maintain the system, the small business may alternatively find it more efficient to contract with a data management service to store and manage their data.

Figure 2:
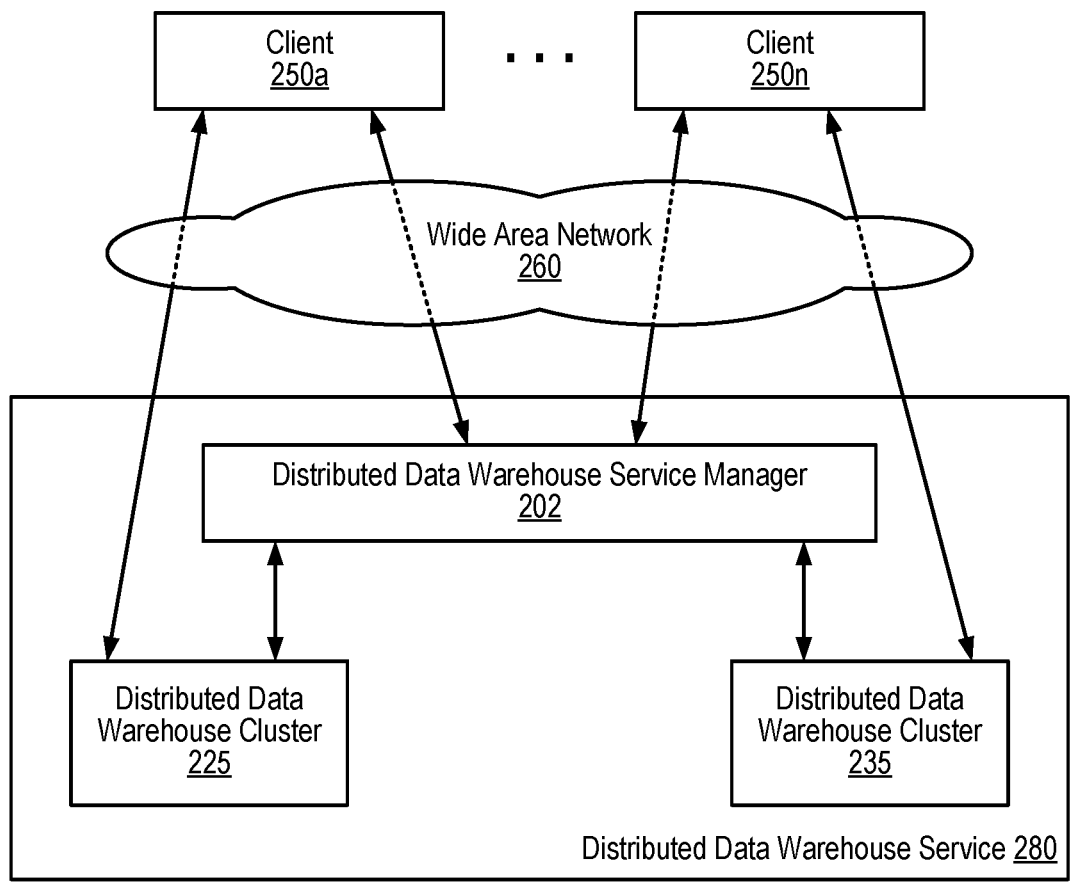
FIG. 2 is a block diagram illustrating an example distributed database warehouse service, according to some embodiments.

A data management service, such as a distributed data warehouse system discussed below with regard to FIGS. 2 through 4, may offer clients a variety of different data management services, according to their various needs. In some cases, clients may wish to store and maintain large of amounts data, such as sales records marketing, management reporting, business process management, budget forecasting, financial reporting, website analytics, or many other types or kinds of data. A client's use for the data may also affect the configuration of the data management system used to store the data. For instance, for certain types of data analysis and other operations, such as those that aggregate large sets of data from small numbers of columns within each row, a columnar database table may provide more efficient performance. In other words, column information from database tables may be stored into data blocks on disk, rather than storing entire rows of columns in each data block (as in traditional database schemes).

In some embodiments, storing table data in such a columnar fashion may reduce the overall disk I/O requirements for various queries and may improve analytic query performance. For example, storing database table information in a columnar fashion may reduce the number of disk I/O requests performed when retrieving data into memory to perform database operations as part of processing a query (e.g., when retrieving all of the column field values for all of the rows in a table) and may reduce the amount of data that needs to be loaded from disk when processing a query. Conversely, for a given number of disk requests, the column field values for many more rows may be retrieved than if each data block stored an entire table rows. In some embodiments, the disk requirements may be further reduced using compression methods that are matched to the columnar storage data type. For example, since each block contains uniform data (i.e., column field values that are all of the same data type), disk storage and retrieval requirements may be further reduced by applying a compression method that is best suited to the particular column data type. In some embodiments, the savings in space for storing data blocks containing only field values of a single column on disk may translate into savings in space when retrieving and then storing that data in system memory (e.g., when analyzing or otherwise processing the retrieved data). For example, for database operations that only need to access and/or operate on one or a small number of columns at a time, less memory space may be required than with traditional row-based storage, since only data blocks storing data in the particular columns that are actually needed to execute a query may be retrieved and stored in memory. To increase the efficiency of implementing a columnar database table, data to be stored in a data block for a column of the columnar database table may be stored according to a multi-level compression scheme as described herein.

FIG. 1 illustrates a dataflow block diagram of a multi-level compression scheme for data stored in a data store, according to some embodiments. In some embodiments, data 102 bound for storage in data block of a data store, such as column 132a of a columnar database table in storage 130 may be received. Data 102 may be compressed according to a primary compression technique. Primary data compressor 110 may receive data 102 and compress data 102 according to the primary technique. Compressed data 102 may be received at a secondary data compressor 120 which in turn may compress the compressed data according to a secondary compression technique to produce multi-level compressed data 106. Multi-level compressed data 106 may then be stored in a data block in a data store, such as column 132a in storage 130.

As illustrated in FIG. 1, data 102 may be received for storage in a data block in a data store, such as column 132a of a columnar database table in storage 130. Data, for instance, may be a list of dates, cites, quantities, or web metrics and, more generally, any other type or form of data value capable of storage in a data block for a column of a columnar database table. A data block may be a unit of data storage (e.g., a data page), a logical abstraction, or physical block of storage that stores these data values in a database or other data store system. In some embodiments, a data store maybe configured to implement a columnar database table that is a column-oriented storage system for data configured to store data values of a column together.

Primary data compressor 110 may receive as input data 102 to be stored in a data block in a data store, such as column 132a. Various hardware devices, software, or a combination of both, may implement primary data compressor 110. In some embodiments, primary data compressor may be column-specific, applying a column-specific compression technique to data stored in data blocks for that specific column of a database table. Primary data compressor 110 may apply a compression technique to data 102 to produce compressed data 104. In some embodiments, one of multiple different primary compression techniques may be applied to data 102, including, but not limited to byte dictionary, text255, text32k, delta, run-length, or mostlyn. Which particular primary compression technique is applied to the data to be stored in the data block may be determined based on metadata describing a group of data blocks including the data block in which the compressed data is to be stored. This metadata may include the type of data stored in the group of data blocks and/or the distribution of data stored in the data blocks. The primary compression technique may also be determined by receiving an indication of a user-selected compression technique (e.g., the indication may also be stored in the metadata describing the group of data blocks or received separately), or a primary compression technique determined for the data to be stored in the data block by primary data compressor 110—such as applying a dynamically or automatically determined compression technique.

Primary data compressor 110 may, in some embodiments, be configured to compress the data blocks storing data included in the same group of data blocks with the same primary compression technique. However, in at least some other embodiments where the group of data blocks store data for a column of a database table, data blocks storing data for the same column may be compressed according to different primary compression techniques. For example, if a group of data blocks store a part of a column of geographic states, and one data block in the column stores 47 different state values and another data block stores only 2 frequently repeating state values, then the first data block may be more efficiently compressed using a dictionary-based compression technique while the second data block for the column may be compressed using a run-length compression technique. Similarly, in at least some embodiments, a primary data compressor 110 or another component or module, such as data access module 460 described below with regard to FIG. 4, may automatically or dynamically determine a more efficient compression technique to be applied to data to be stored in a data block in place of a user-selected or default compression technique to be applied to the data block.

The primary compression technique applied to data 102 may be identified, updated, or stored in block metadata. This block metadata may be a data structure or other collection of information about the data block. For example, in some embodiments the primary compression technique may be identified in a respective entry in a superblock data structure, such as superblock 470 described below with regard to FIG. 4, that includes entries for multiple data blocks storing data for the columnar database table. Entries for the data block in the superblock data structure may contain many different other types of metadata for the data block in addition to identifying the primary compression technique, such as the size of the compressed data, a unique identifier, or storage location. However, other data structures, locations, or schemes may be used to store metadata for the data block. For example, in some embodiments, an indicator of a primary compression technique applied to a data block may be stored in the data block itself, such as in a specified or known location.

As illustrated secondary data compressor 120 may receive as input the compressed data 104 produced by the primary data compressor 110. Please note, that when referring to the compressed data received as input, the compressed data may also include any additional data including the compressed data or different versions of the compressed data (such as those modified by various different processes). More generally, the data received at each stage of the various embodiments implementing a multi-level compression schema may receive data including additional data or modified versions of the data. Secondary data compressor 120 may be implemented using various hardware devices, software, or some combination of both hardware and software to compress the data based on the compressed data according to a default or second compression technique. In some embodiments, the secondary compression technique is determined independent from the metadata describing the group of data blocks including the data block, such as the type of data stored in the data blocks or the distribution of data stored in the data blocks. For example, the second compression technique may be a byte-oriented, binary, or other generic compression technique that is agnostic as to the other data blocks of the group of data blocks including the data block. The secondary compression technique may be a system compression technique (e.g., a default compression technique) that is applied to data prior to storage. Secondary data compressor 120 may produce multi-level compressed data 106 to be stored in a data store, such as column 132a in storage 130. In at least some embodiments, block metadata for the data block storing the multi-level compressed data, such as a respective entry for the data block in a superblock data structure, may be updated to indicate the r secondary compression technique applied to the compressed data.

Storage 130 may be one or more storage devices implementing a data store, such as storage disk devices or other type of storage devices configured to store data for a columnar database table. In FIG. 1, storage 130 is configured to store data for columns 132a through 132n. In at least some embodiments, storage 130 may be distributed across multiple different nodes in a distributed database system.

In various embodiments, an indication of a query may be directed toward column 132a for select data. The multi-level compressed data 106 from the data block in storage may be read. A decompression engine or other kind of module or device may be configured to decompress the multi-level compressed data according to the secondary compression technique to produce secondary compressed data. The secondary compression technique applied may be identified by block metadata for the data block. Subsequently, another decompression engine or other module or device may be configured to decompress data based on the default decompressed data according to the primary compression technique to produce decompressed data. As with the secondary compression technique, the primary compression technique applied may be identified by the block metadata for the data block.

In at least some embodiments, a compressed size of the multi-level data is calculated for the multi-level compressed data. The compressed size may be stored along with the other metadata for the data block, such as in, for example, respective entries for the data block in a superblock data structure. When processing the query, such as the indication of the query discussed above, the amount of data read from the data block may be determined according to the compressed size of the multi-level compressed data for the data block.

Other techniques for processing queries may utilize block metadata. For instance, the indicators for some compression techniques may also indicate the data values stored in a given data block. For example, the indicator for a dictionary compression technique may include the different data values stored in the data block. If a data value for servicing a particular query is not to be found in the indicator, then the block may not be read.

Embodiments of compressing data to be stored in a data store according to a multi-level compression scheme may be implemented in a variety of different database management systems, such as those implementing a columnar database table. Data management services, such as distributed data warehouse services or other database services offered to clients, may also implement multi-level compression for client data stored with the data management service. Similarly client owned, operated, or controlled database systems may also implement a multi-level compression scheme. More generally, any system that stores data in a data store may implement various embodiments of compressing data according to a multi-level scheme, and thus, the previous examples need not be limiting as to various other systems envisioned.

Implementing Multi-Level Compression in Distributed Data Warehouse System

As discussed above, various clients (or customers, organizations, entities, or users) may wish to store and manage data using a data management service. FIG. 2 illustrates an example distributed data warehouse service that may provide data management services to clients, according to some embodiments. Specifically, distributed data warehouse clusters may respond to store requests (e.g., to write data into storage) or queries for data (e.g., such as a Structured Query Language request (SQL) for select data), along with many other data management or storage services.

Multiple users or clients may access a data warehouse cluster to obtain data warehouse services. Clients which may include users, client applications, and/or data warehouse service subscribers), according to some embodiments. In this example, each of the clients 250a through 250n is able to access distributed data warehouse cluster 225 and 235 respectively in the distributed data warehouse service 280. Distributed data warehouse cluster 225 and 235 may include two or more nodes on which data may be stored on behalf of the clients 250a through 250n who have access to those clusters.

A client, such as clients 250a through 250n, may communicate with a distributed data warehouse cluster 225 or 235 via a desktop computer, laptop computer, tablet computer, personal digital assistant, mobile device, server, or any other computing system or other device, such as computer system 1000 described below with regard to FIG. 8, configured to send requests to the distributed data warehouse clusters 225 and 235, and/or receive responses from the distributed data warehouse clusters 225 and 235. Requests, for example may be formatted as a message that includes parameters and/or data associated with a particular function or service offered by a data warehouse cluster. Such a message may be formatted according to a particular markup language such as Extensible Markup Language (XML), and/or may be encapsulated using a protocol such as Simple Object Access Protocol (SOAP). Application programmer interfaces (APIs) may be implemented to provide standardized message formats for clients, such as for when clients are communicating with distributed data warehouse service manager 202.

Clients 250a through 250n may communicate with distributed data warehouse clusters 225 and 235, hosted by distributed data warehouse service 280 using a variety of different communication methods, such as over Wide Area Network (WAN) 260 (e.g., the Internet). Private networks, intranets, and other forms of communication networks may also facilitate communication between clients and distributed data warehouse clusters. A client may assemble a message including a request and convey the message to a network endpoint (e.g., a Uniform Resource Locator (URL)) corresponding to the data warehouse cluster). For example, a client 250a may communicate via a desktop computer running a local software application, such as a web-client, that is configured to send hypertext transfer protocol (HTTP) requests to distributed data warehouse cluster 225 over WAN 260. Responses or other data sent to clients may be formatted in similar ways.

In at least some embodiments, a distributed data warehouse service, as indicated at 280, may host distributed data warehouse clusters, such as clusters 225 and 235. The distributed data warehouse service 280 may provide network endpoints to the clients 250a to 250n of the clusters which allow the clients 250a through 250n to send requests and other messages directly to a particular cluster. As noted above, network endpoints, for example may be a particular network address, such as a URL, which points to a particular cluster. For example, client 250a may be given the network endpoint "http://mycluster.com" to send various request messages to. Multiple clients (or users of a particular client) may be given a network endpoint for a particular cluster. Various security features may be implemented to prevent unauthorized users from accessing the clusters. Conversely, a client may be given network endpoints for multiple clusters.

Distributed data warehouse clusters, such as distributed data warehouse cluster 225 and 235, may be made up of one or more nodes. These clusters may include different numbers of nodes. A node may be a server, desktop computer, laptop, or, more generally any other computing device, such as those described below with regard to computer system 1000 in FIG. 8. In some embodiments, the number of nodes in a distributed data warehouse cluster may be modified, such as by a cluster scaling request. Nodes of a distributed data warehouse cluster may implement one or more data slices for storing data. These data slices may be part of storage devices, such as the disk storage devices discussed below with regard to FIGS. 3 and 4. Clusters may be configured to receive requests and other communications over WAN 260 from clients, such as clients 250a through 250n. A cluster may be configured to receive requests from multiple clients via the network endpoint of the cluster.

In some embodiments, distributed data warehouse service 280 may be implemented as part of a web service that allows users to set up, operate, and scale a data warehouse in a cloud computing environment. The distributed data warehouse clusters hosted by the web service may provide an enterprise-class database query and management system that allows users to scale the clusters, such as by sending a cluster scaling request to a cluster control interface implemented by the web-service. Scaling clusters may allow users of the web service to perform their data warehouse functions, such as fast querying capabilities over structured data, integration with various data loading and ETL (extract, transform, and load) tools, client connections with best-in-class business intelligence (BI) reporting, data mining, and analytics tools, and optimizations for very fast execution of complex analytic queries such as those including multi-table joins, sub-queries, and aggregation, more efficiently.

In various embodiments, distributed data warehouse service 280 may provide clients (e.g., subscribers to the data warehouse service provided by the distributed data warehouse system) with data storage and management resources that may be created, configured, managed, scaled, and terminated in response to requests from the client. For example, in some embodiments, distributed data warehouse system 280 may provide clients of the system with distributed data warehouse clusters composed of virtual compute nodes. These virtual compute nodes may be nodes implemented by virtual machines, such as hardware virtual machines, or other forms of software implemented to simulate hardware configurations. Virtual nodes may be configured to perform the same tasks, functions, and/or services as nodes implemented on physical hardware.

Distributed data warehouse service 280 may be implemented by a large collection of computing devices, such as customized or off-the-shelf computing systems, servers, or any other combination of computing systems or devices, such as the various types of devices described below with regard to FIG. 8. Different subsets of these computing devices may be controlled by distributed data warehouse service manager 202. Distributed data warehouse service manager 202, for example, may provide a cluster control interface to clients, such as clients 250a through 250n, or any other clients or users who wish to interact with the distributed data warehouse clusters managed by the distributed data warehouse service manager 202, which in this example illustration would be distributed data warehouse clusters 225 and 235. For example, distributed data warehouse service manager 202 may generate one or more graphical user interfaces (GUIs) for storage clients, which may then be utilized to select various control functions offered by the control interface for the distributed data warehouse clusters hosted in the distributed data warehouse service 280.

Figure 3:
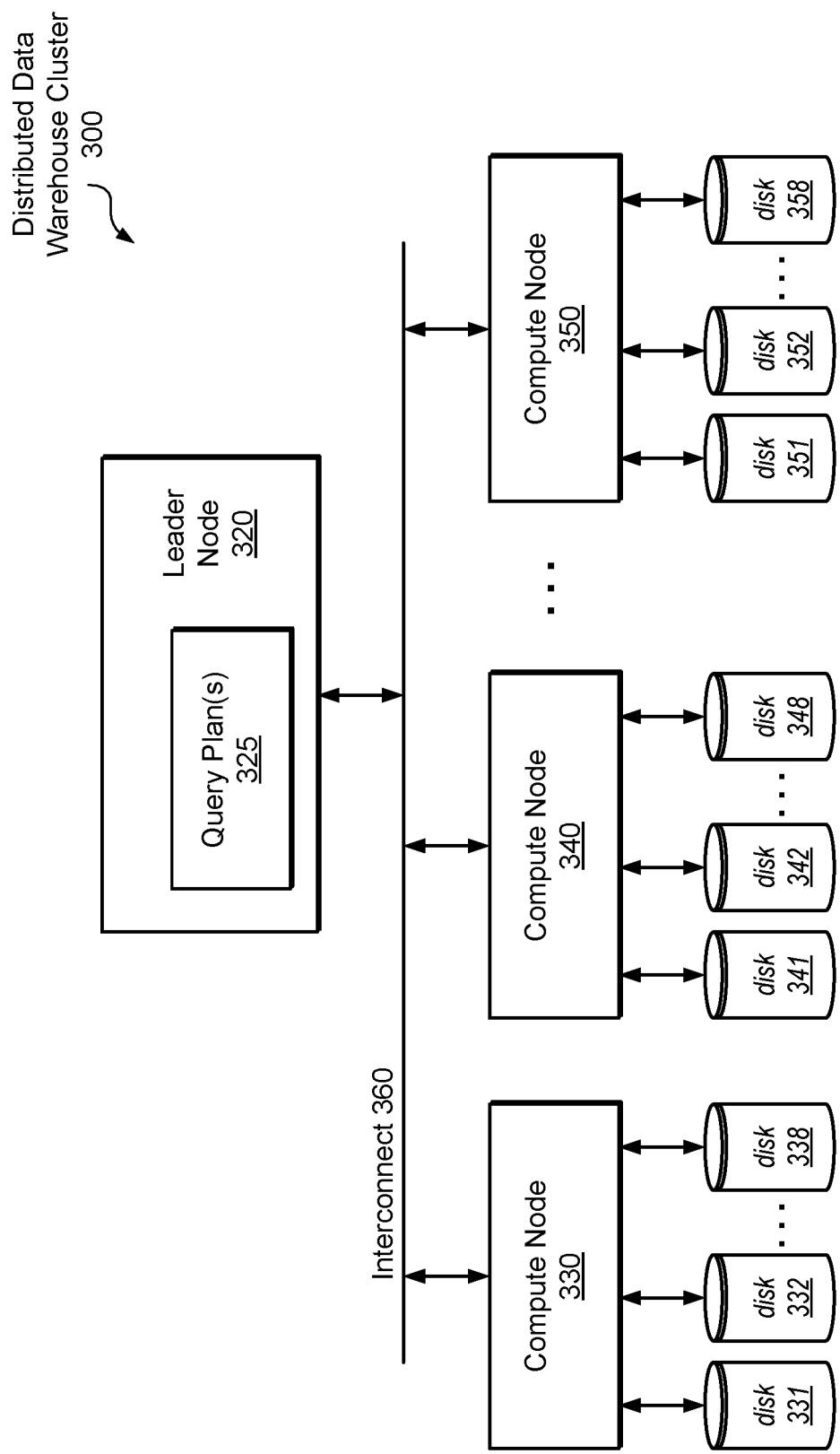
FIG. 3 is a block diagram illustrating an example distributed data warehouse cluster, according to some embodiments.

FIG. 3 is a block diagram illustrating a distributed data warehouse cluster in a distributed data warehouse service, according to one embodiment. As illustrated in this example, a distributed data warehouse cluster 300 may include a leader node 320 and compute nodes 330, 340, and 350, which may communicate with each other over an interconnect 360. Leader node 320 may generate and/or maintain one or more query plans 325 for executing queries on distributed data warehouse cluster 300. As described herein, each node in a distributed data warehouse cluster may include multiple disks on which data blocks may be stored on behalf of clients (e.g., users, client applications, and/or distributed data warehouse service subscribers). In this example, compute node 330 includes disks 331-338, compute node 340 includes disks 341-348, and compute node 350 includes disks 351-358. In some embodiments, a component of the distributed data warehouse cluster (or the distributed data warehouse system of which it is a component) may support load balancing, using any of a variety of applicable load balancing techniques. For example, in some embodiments, leader node 320 may include a load balancing component (not shown).

In at least some embodiments, distributed data warehouse cluster 300 may be implemented as part of the web based data warehousing service, such as the one described above, and includes a leader node 320 and multiple compute nodes, such as compute nodes 330, 340, and 350. The leader node 320 may manage communications with clients, such as clients 250a through 250n discussed above with regard to FIG. 2. For example, a leader node may be a server that receives requests from various client programs (e.g., applications) and/or subscribers (users), then parses them and develops an execution plan (e.g., query plan(s) 325) to carry out the associated database operation(s). More specifically, the leader node may develop the series of steps necessary to obtain results for complex queries and joins. Leader node 320 may also manage the communications among compute nodes 330 through 350 instructed to carry out database operations for data stored in the distributed data warehousing cluster 300. For example, compiled code may be distributed by leader node 320 to various ones of the compute nodes 330 to 350 to carry out the steps needed to perform queries, and intermediate results of those queries may be sent back to the leader node 320. Leader node 320 may receive data and query responses or results from compute nodes 330, 340, and 350. A database schema and/or other metadata information for the data stored among the compute nodes, such as the data tables stored in the cluster, may be managed and stored by leader node 320.

Distributed data warehousing cluster 300 may also include compute nodes, such as compute nodes 330, 340, and 350. These one or more compute nodes, may for example, be implemented on servers or other computing devices, such as those described below with regard to computer system 1000 in FIG. 8, and each may include individual query processing "slices" defined, for example, for each core of a server's multi-core processor. Compute nodes may perform processing of database operations, such as queries, based on instructions sent to compute nodes 330, 340, and 350 from leader node 320. The instructions may, for example, be compiled code from execution plan segments and steps that are executable by the particular data compute node to which it is sent. Data compute nodes may send intermediate results from queries back to leader node 320 for final aggregation. Each data compute node may be configured to access a certain memory and disk space, such as illustrated in FIG. 4, in order to process a portion of the workload for a query (or other database operation) that is sent to one or more of the compute nodes 330, 340 or 350. Thus, compute node 330, for example, may access disk 431, 432, up until disk 438.

Disks, such as the disks 331 through 358 illustrated in FIG. 3, may be may be implemented as one or more of any type of storage devices and/or storage system suitable for storing data accessible to the data compute nodes, including, but not limited to: redundant array of inexpensive disks (RAID) devices, disk drives or arrays of disk drives such as Just a Bunch Of Disks (JBOD), (used to refer to disks that are not configured according to RAID), optical storage devices, tape drives, RAM disks, Storage Area Network (SAN), Network Access Storage (NAS), or combinations thereof. In various embodiments, disks may be formatted to store columnar database tables through various column-oriented database schemes.

In some embodiments, each of the compute nodes in a distributed data warehouse cluster may implement a set of processes running on the node server's (or other computing device's) operating system that manage communication with the leader node, e.g., to receive commands, send back data, and route compiled code to individual query processes (e.g., for each core or slice on the node) in order to execute a given query. In some embodiments, each of compute nodes includes metadata for the blocks stored on the node. In at least some embodiments this block metadata may be aggregated together into a superblock data structure, which is a data structure (e.g., an array of data) whose entries store information (e.g., metadata about each of the data blocks stored on that node (i.e., one entry per data block). In some embodiments, each entry of the superblock data structure includes a unique ID for a respective block, and that unique ID may be used to perform various operations associated with data block. For example, indications of column-specific compression techniques applied to the data stored in the data block, indications of default compression techniques applied to the data stored in the data block, or probabilistic data structures that indicate data values not stored in a data block may all be stored in the respective entry for a data block. In some embodiments, the unique ID may be generated (and a corresponding entry in the superblock created) by the leader node or by a computing node when the data block is first written in the distributed data warehouse system.

Figure 4:
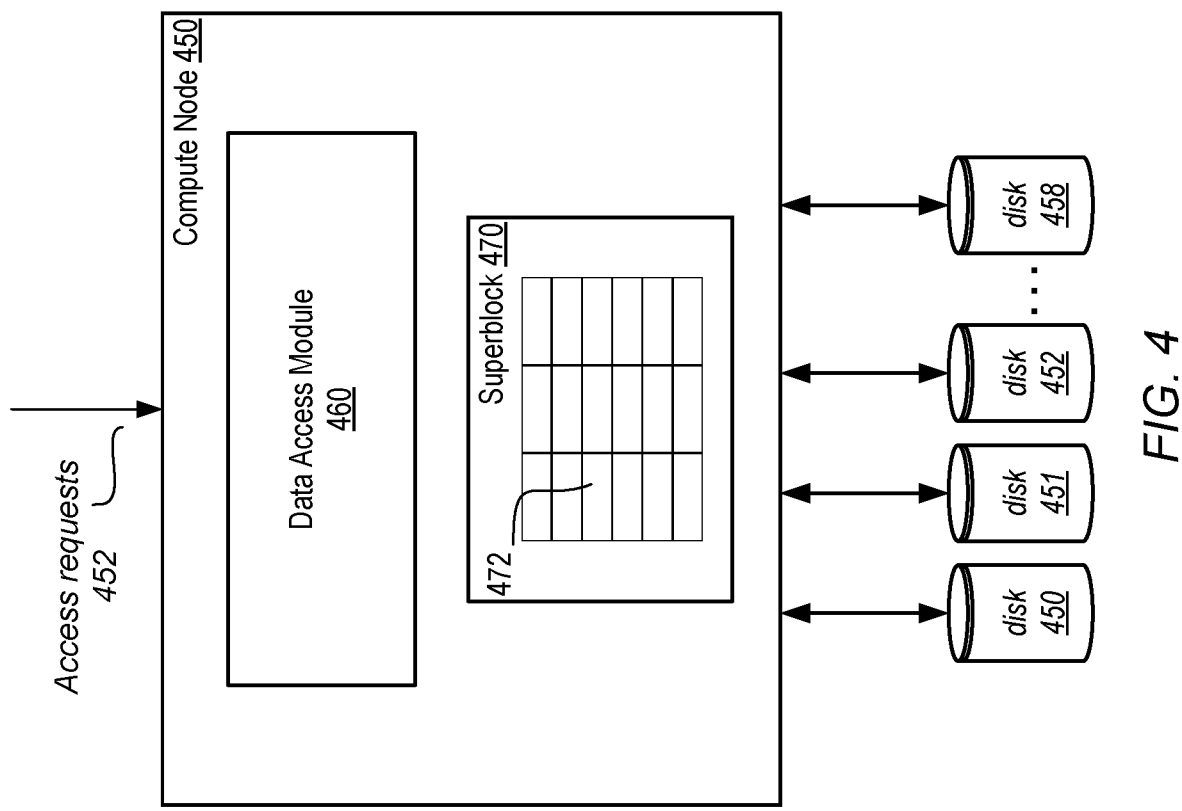
FIG. 4 is a block diagram illustrating an example compute node, according to some embodiments.

FIG. 4 illustrates an example of a compute node, according to some embodiments. Access requests 452, such as the various queries and messages sent to a leader node, such as leader node 320, and sent from a leader node to a compute node, may be received at compute node 450. A data access module 460, described in further detail below with regard to FIG. 5, may process access requests, directing reads, writes, and other access operations to disks 450 through 458. In some embodiments, a compute node 450 may also include a superblock data structure 470, such as the superblock data structure described above, stored locally at the compute node or stored remotely, but accessible to the compute node, which may include respective entries 472 for the data blocks stored on the compute node 450 which store block metadata including, but not limited to, the above described indications of primary or column-specific compression techniques applied to the data stored in the data block, indications of system or secondary compression techniques applied to the data stored in the data block, or probabilistic data structures that indicate data values not stored in a data block. Note, however, that in some embodiments metadata for data blocks may be stored in multiple different locations, such as in the data block itself, or in in other individual data structures. Therefore, the superblock data structure 470 is not intended to be limiting as to the various other structures, locations, methods, or techniques which might be applied to preserve metadata information for the data block.

Figure 5:
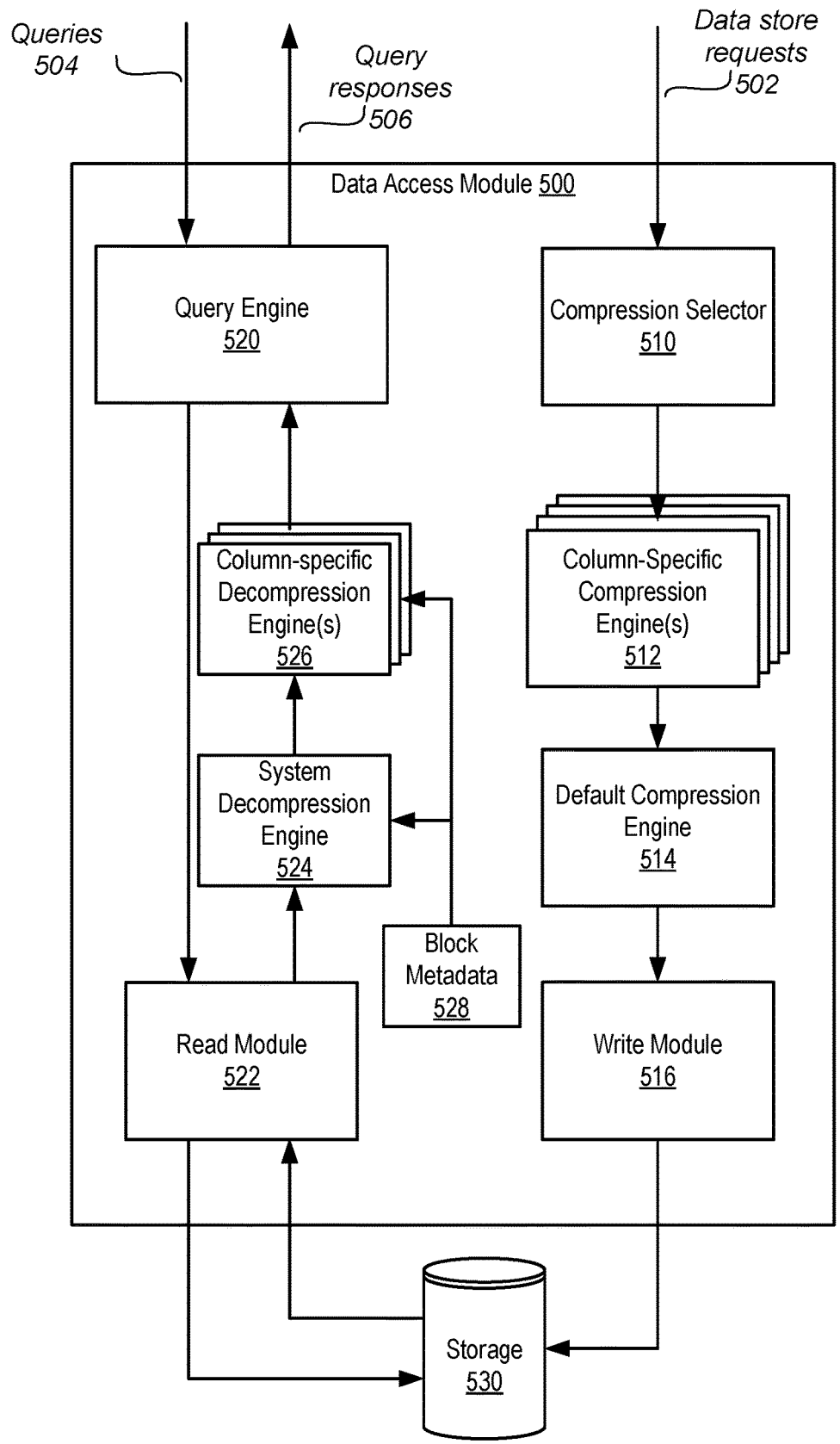
FIG. 5 is a block diagram illustrating an example data access module that implements a multi-level compression scheme, according to some embodiments.

As discussed above, a compute node may be configured to receive access requests, such as queries, storage operations, and other data management operations. FIG. 5 illustrates an example data access module that implements a multi-level compression scheme for data to be stored in a data block of a columnar database table, according to some embodiments. Queries 504 and data store requests 502, or indications of queries or data store requests, may be received as inputs to data access module 500. Data access module 500 may communicate with storage 530, which may store a plurality of data blocks for multiple columns of a columnar database table. Multi-level compressed data may be stored in storage 530 in the plurality of data blocks, and data access module 500 may be configured to both store the multi-level compressed data and read the multi-level compressed data.

Data access module 500 may be implemented on a compute node, such as compute node 450 described above with regard to FIG. 4. Various different configurations of hardware and software components may be used to implement the data access module 500 as well as the components or modules illustrated within. Also note that, although different modules or components are illustrated within data access module as one or more distinct modules or devices, these various components may be combined together, located differently, or alternatively configured to implement a multi-level compression scheme for data stored in a data store. Although FIG. 5 is described in terms of storing data in a data block for a columnar database table, the following description of FIG. 5 is not intended to be limiting as to the various other ways a data access module or similar module or device may be implemented to store data in a data block in a data store.

Data store requests 502 which may include data to be stored in a data block for a column of the columnar database table stored in storage 530. For example, the data for storage in a data block in storage 530 may be obtain the data via an Open Database Connectivity (ODBC) and/or Java Database Connectivity (JDBC) driver interface or other component that is configured to receive storage request information and data for storage. Compression selector 510 may receive the data and determine a particular column-specific compression technique to be applied to the data. For example, in some embodiments, compression selector 510 may receive an indication of a user-selected compression technique, such as a dictionary compression technique, which is to be applied to the data in a data store request 502. This user-selection may be obtained from the request itself, column metadata or database design or schema data, or any other message or indication that provides the selection of a compression technique. In at least some embodiments, the compression selector may select a column-specific compression technique based on metadata describing a column of a columnar database table.

In some embodiments, one of many different column-specific compression techniques may be applied to the data for storage in a data block, and compression selector 510 may be configured to select a particular one of these column-specific compression techniques. Data analysis and/or other forms of evaluative logic may be implemented at compression selector 510 which makes a determination of the column-specific compression technique to be applied. In some embodiments, this evaluation or analysis may be performed dynamically or automatically upon receipt of the data, and in at least some embodiments, the dynamically or automatically determined column-specific compression technique may be applied to the data to be stored in place of a user-selected compression technique. For example, compression selector 510 may consider data type compatibility. Some compression techniques may not work with all data types. For instance, byte dictionary compression technique may not be applied to a varchar column data type. Compression selector 510 may also consider the expected size of the domain of data values stored in a column (e.g., how many unique values are likely to be loaded into the column). In some cases, the domain is known. For example, only 50 valid state abbreviations exist for a United States state column. In other cases, the precise domain may be unknown or more difficult to quantify. Distribution of the data, such as data skew, may also be considered by compression selector 510 (e.g., determining whether a given set of data values dominates the domain). In at least some embodiments, compression selector 510 may determine that a compressed size of the data would be larger than the raw size of the data. In such cases, data compression selector 510 may select a raw data compression for the column-specific compression technique. Metadata describing a group of data blocks that include that data block that will store the data may also include various descriptors that may be used to determine the primary compression technique. Data samples, probabilistic data structures (i.e., data structures that determine whether a given value is a member of a set), and a variety of types of information, such as indicator of a data type or value, may be included in the metadata.

In some embodiments, different data store requests 502 may include different data to be stored in data blocks for different columns of the columnar database table in storage 530. For data to be stored in data blocks for these different columns of the columnar database table compression selector 510 may select different ones of the column-specific compression engines 512. For example, data to be stored for a column storing dates may use a delta compression technique, while data to be stored for a column storing customer gender may use run-length compression.

A column-specific compression engine 512, selected by compression selector 510, may then receive as input the data to be stored in a data block for the columnar database table in storage 530. Column-specific compression engine 512 may be capable of applying one or more column-specific compression techniques to the data to produce compressed data. Many different compression techniques may be applied as column-specific compression techniques, including, but not limited to byte dictionary, text255, text32k, delta, run-length, mostlyn, or more generally any other form of lossless data compression technique. Different ones of column specific compression engines 512 may be capable or configured to compress data according to a different one of these column-specific compression techniques. In at least some embodiments, data access module 500 may determine that the size of the compressed data produced by column-specific compression engine 512 is larger than the raw data prior to applying the column-specific compress technique. Logic may be implemented that selects a different one of the column-specific compression engines 512 to compress the data according to a different column-specific compression technique, or selects to leave the data in a raw data format (e.g., such as when the compressed data format is larger than the raw data format, or when a raw data format is indicated).

System compression engine 514 may receive as input data based on the compressed data produced by column-specific compression engine 512. In at least some embodiments, the data may be the compressed data produced, but alternatively, in different embodiments further manipulations or processing of the compressed data may occur before the data is received at default compression engine 512. For example, if the column-specific compression technique applied to the data is a dictionary compression, the data values used to index the dictionary compression technique may be stored in a data structure for future query processing. Or, in another case an indicator may be appended to the compressed data to identify the column-specific compression technique applied to the data.

A system compression technique may be applied to the compressed data by system compression engine 514, such as a generic or data type independent compression technique, such as run-length compression, Lempel-Ziv, Lempel-Ziv-Oberhumer, bzip, etc. As discussed above, the compressed data may include additional data with the compressed data or modified versions of the compressed data. Many different compression techniques are well-known to those of ordinary skill in the art and, thus, the previous examples are not intended to be limiting. Applying the system compression technique to the data based on the compressed data, system compression engine 514 produces multi-level compressed data.

A write module 516 may also be implemented by data access module 500 to store the multi-level compressed data in storage 530. Other data, such as data in raw format, or data only compressed according to the system compression technique by system compression engine 514 may also be stored by write module 516. Write module 516 (or another module or modules, such as the compression selector 510, column-specific compression engine 512, and/or default compression engine 514) may update block metadata 528 with the column-specific compression technique and the default compression technique applied to the multi-level compressed data. Block metadata 528 for other data stored in storage module 530, such as data in raw format, or data only compressed according to the system compression technique, may also be updated. Additionally, in some embodiments write module 516 may also be configured to calculate a compressed size for the multi-level compressed data stored in the data block, and then update the block metadata for the data block to indicate the compressed size for multi-level compressed data stored in the data block.

Data access module 500 may also receive queries 504, or indications of queries, such as queries for select data stored in storage 530. For example, a leader node, such as leader node 320 described above with regard to FIG. 3, may receive a query from a storage client, and generate a query execution plan which sends the query to a compute node implementing data access module 500. Data access module 500 may implement a query engine 520 to process and receive the queries. As discussed above queries may be instructions to be executed according to a query plan, but may also be more generally any type of request for data that meets a specified criterion or is generated by a specified process. As query engines 520 are well-known to those of ordinary skill in the art, the previous description is not intended to be limiting as to the many different techniques and implementations of a query engine. For example, a standard query engine configured to process standard database protocol messages, such as SQL requests, may be implemented, or alternatively a query engine that processes customized queries, such as those specified by an API may be used.

In some embodiments, therefore, a query engine 520 may receive an indication of a query directed to a column of the columnar database table in storage 530 for select data. In response to receiving the indication of the query, query engine 520 may direct read module 522 to read multi-level compressed data from a data block in storage 530 in order to service the query. Read module 522 may then read multi-level compressed data from a data block in storage 530. Raw format data, as well as system compressed data may also be read from storage 530.

In at least some embodiments, read module 522 may be directed by query engine 520 to read an amount of data from the data block according to the compressed size of the multi-level compressed data stored in the data block as indicated by the block metadata for the data block. For example, if the compressed size of the multi-level compressed data were 3 megabytes, then read module 522 may be directed to read only the first three megabytes of the data block storing the multi-level compressed data. The compressed size of the multi-level compressed data may be obtained from the block metadata 526. By reading only the amount of compressed data values stored in the data block, less read operations may be performed, leading to a faster and more efficient time spent reading data from storage 530.

Read module 522 may also transfer data read from storage 530 to a database cache or other module or device part that provides storage for more frequently accessed data when processing queries 504. In some embodiments, multi-level compressed data may be maintained in a cache for more efficient query processing, or alternatively, the multi-level compressed data may be decompressed and then stored in a cache module or device. As a variety of different caching techniques for data management and storage systems are well-known to those of ordinary skill in the art, the previous examples are not intended to be limiting.

System decompression engine 524 may receive as input the multi-level compressed data. An indicator of the system compression technique applied to the data block may be identified in block metadata 528. For example, the system compression technique applied to the data may be the bzip compression technique, and therefore the system compression engine of the decompression engines 524 may be capable of or configured to decompress the multi-level compressed data according to the identified bzip compression technique. System decompression engine 524 may then produce system decompressed data. Column-specific decompression engines 526 may receive as input data based on the system decompressed data produced by system decompression engine 524. Similar to the system decompression engine 524, a column-specific decompression engine of the column-specific decompression engines 526 may also be selected or configured to decompress the column-specific compression technique indicated at block metadata 528 to produce decompressed data. This decompressed data may then be provided to the query engine 520 for servicing the query. For example, if the query 504 is a request for select data that only includes sales of products sold in the month of June, then decompressed data from the decompression engines may be provided to query engine to filter out from the decompressed data those records that do not meet the selection criterion of June.

Query engine 520 may provide at least some of the decompressed data in a query response 506 to a storage client, leader node, or other requesting system or device. However, in some embodiments query engine may obtain multi-level compressed data, default compressed data, raw data directly from read module 522, and in turn provide the multi-level compressed data, default compressed data, or raw data to a storage client, leader node, or other requesting system or device. Query engine 520 may also be configured to analyze the multi-level compressed data or default decompressed data to determine whether data values for a query requesting select data may be stored in a data block, and thus, whether further decompression should be applied. For example, if a type of column-specific compression is only applicable for certain data types, then query engine 520 may presume that a data block compressed according to that column-specific compression technique may not include excluded data types, and thus data values, stored in that data block.

Although not illustrated, in at least some embodiments, write module 516, or some other store/write module, component, or I/O layer, may include system compression engine 514 as part of the write module 516. Thus, write module 516 may receive compressed data produced by column-specific compression engines 512 and automatically direct the system compression engine 514, or some other component configured to compress the data based on the compressed data according to the system compression technique. Write module 516 may incorporate the system compression engine 514 as a default compression technique applied to data written to data blocks via the write module 516. Similarly, read module 522, or some other fetch/read module, component, or I/O layer, may include system decompression engine 524 as part of the read module 522. Read module 522 may read data from storage 530 and automatically direct system decompression engine 524 to decompress data according to the system compression technique. Read module 514 may, therefore, incorporate the system decompression engine 524 as a default decompression.

Write module 516 and read module 522 may incorporate the system compression engine 514 and system decompression engine 524 together as one I/O (input/output) module. For example, read module and write module 516 may together be incorporated as an I/O layer in a software application. This layer may receive data compressed according to a column-specific or other primary compression technique. or raw data. and automatically compress it according to a system compression technique before writing the data to a data block. Likewise, when responding to a read request, the I/O layer may read data from storage 530 and automatically decompress the data according to the system compression technique before providing it to other components, such as column-specific decompression engines 526, a data cache, query engine, client, or other system.

Although FIGS. 2 through 5 have been described and illustrated in the context of a distributed data warehousing system, the various components illustrated and described in FIGS. 2 through 5 may be easily applied to other data management systems that provide data management and/or storage services for a storing data in a data store. For example the illustrated storage devices or disks need not be configured as columnar database tables, but may instead implement traditional row-oriented database tables. Moreover, the configuration of components, systems, or devices show are not limiting as to other possible configurations. FIG. 3, for example illustrates a distributed data warehouse cluster 300 including a leader node, but in some embodiments a distributed data warehouse cluster may operate without a leader node. FIG. 5, for instance, is illustrated as one module, data access module 500, and yet, many different devices may be configured to perform the various functions of the modules illustrated in a distributed manner across many different systems. As such, FIGS. 2 through 5 are not intended to be limiting as to embodiments of a distributed data warehouse cluster, nor limiting a description of a data storage and management cluster.

Workflow of Storing Data in a Data Store with Multi-Level Compression

Figure 6:
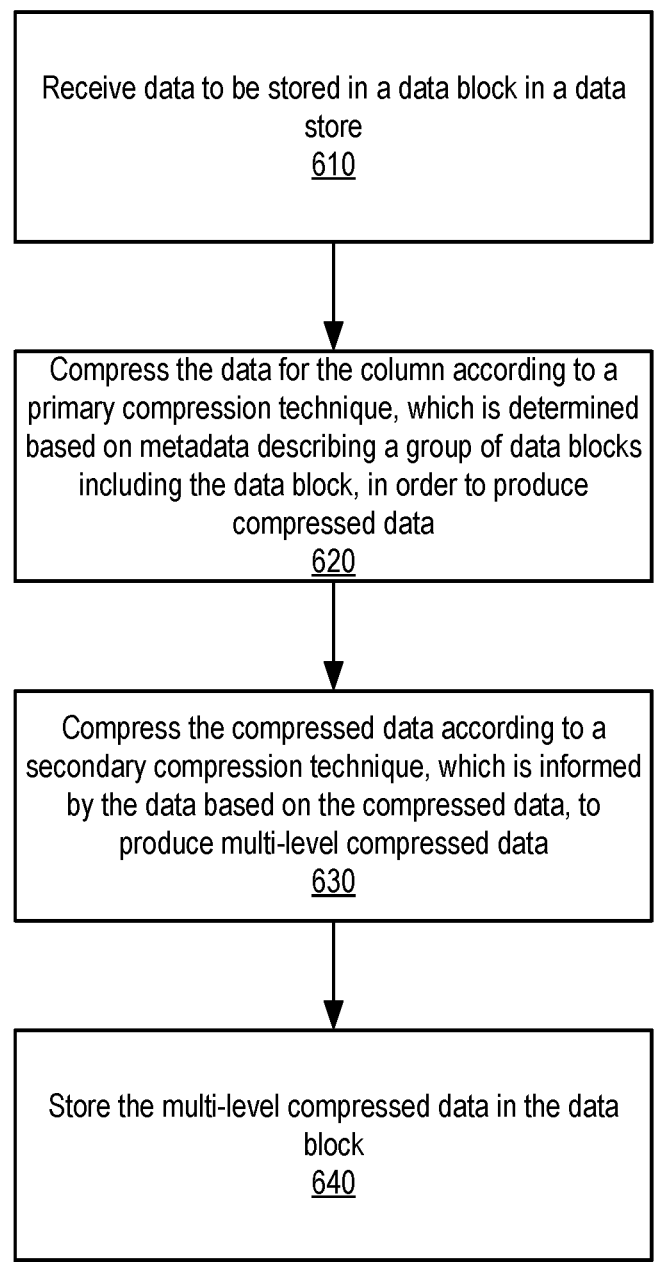
FIG. 6 is a high-level flowchart illustrating a method to store data in data block in a data store implementing a multi-level compression scheme, according to some embodiments.

As has been discussed above, database management systems may be configured to utilize columnar database tables to provide more efficient data management functions. However, as has also been mentioned, a multi-level compression schema may provide efficiency benefits more generally to any type of data store managing and storing data. FIG. 6 is a high-level flowchart illustrating a method to store data in data block of a data store implementing a multi-level compression scheme, according to some embodiments. Various different systems and devices may implement the various methods and techniques described below. A data access module, such as data access module 500 described above in FIG. 5, may implement the various methods. Alternatively, a combination of different systems and devices, such as the multiple compute nodes illustrated in FIG. 3 working in together, for example, may also perform the below method and techniques. Therefore, the above examples and or any other systems or devices referenced as performing the illustrated method, are not intended to be limiting as to other different individuals or configurations of systems and devices.

When implementing a multi-level compression scheme, data to be stored in a data block in a data store may first be received, as indicated at 610. This data may be formatted according to a variety of different messaging schemes, formats, and/or protocols, such as those discussed above with regard to FIGS. 3 to 5. The data may, for example, represent a portion of data values for a column of a columnar database table, or alternatively data for a row of a row-oriented database scheme (which stores the data values for a row of a database). Different data types, such as those well-known to those of ordinary skill in the art, like various integers, chars, strings, etc. may be stored. In addition, the type of data value, such as the specific information stored in a group of data blocks including the data block may also be indicated in the message or other communication that includes the data to be stored. For example, the data may be a list of dates and the request may also include metadata describing a group of data blocks, such as those data blocks storing data for a column, that are indicated as storing date values.

Once received, the data to be stored in the data block may be compressed according to a primary compression technique, which is determined based on metadata describing a group of data blocks including the data block, to produce compressed data, as indicated at 620. Many different compression techniques exist and are well-known to those of ordinary skill in the art, such as text32k, delta, run-length, mostlyn. However, in some embodiments any other form of lossless data compression technique may be envisioned for column-specific compression.

Determining a particular one of these compression techniques to apply as the column-specific compression technique to the data may be based on metadata describing a group of data blocks including the data block for which the received data is bound for storage. Groups of data blocks including the data block for which the received data is bound may be associated by logical organization, such as those data blocks storing data for a specific row or specific column of a database table. Or alternatively, the group of data blocks may be associated by the type of data values stored in the data block, such as data blocks that store date values. The metadata describing the group of data blocks including the data block may include many different types of information. In some embodiments, a type of data value stored in the group of data blocks may be included in the metadata. This type of data value may be one of the many common data types well-known to those of ordinary skill in the art, such as chars, integers, strings, floats, etc. However, the type of data value may also be customized, such as dates, product numbers, metric type (e.g., different web analytic measurements), customer gender, etc.

Metadata may also include a representation of the distribution of data stored in the group of data blocks. For example, a data structure containing a sample of data stored in the data blocks may be used to describe the distribution. Similarly, a representation of a histogram showing the distribution of data values stored in the various ranges of the histogram may also be used. In some embodiments, metadata may include an indication of a user-selected compression technique for data to be stored in a certain column may be detected. For example, the message or communication that includes the data to be stored may indicate a user-selected compression technique to be included in metadata describing the group of data blocks including the data block for which the data is bound. More generally, metadata for a group of data blocks may include a data store scheme or other set of information that provides information about the group of data blocks including the data block for which the data is bound that may not be found in the data blocks themselves. For example, a database scheme or other set of information about the data store may also include automatically applied primary compression techniques. For example, the database scheme may indicate that data bound for data blocks storing data for column 1 is to be compressed according to a mostlyn compression technique, while column 2 is to be compressed using a dictionary compression technique.

Determining a primary compression technique based on the metadata may be performed in a variety of different ways. For example, the technique may be determined by matching compression techniques predetermined for certain types of data stored in the group of data blocks to the type of data value stored in the data block for which the data is bound. For example, data may be bound for storage in a data block that is included in a group of data blocks storing integers. Integers may have a predetermined compression technique, and thus the predetermined compression technique would be matched to the received data and applied. Similar evaluations may be made using other types of data stored in the group of data block, such as those mentioned above, including customized data types like date values, etc. An Application Programming Interface (API) may, for example, define these customized data types and their predetermined compression techniques.

Metadata may also be used for further analysis to determine the compression technique, combining one or more types of information described in the metadata. For example, the type of data values stored in the group of data blocks may be used as a filter to narrow the possible compression techniques to a reduced set of possible compression techniques, and then a representation of the distribution of the data in the data blocks may be used to determine the one compression technique to be applied. For example, the type of data value may be an integer, limiting compression to a subset of compression techniques, and then the representation of the distribution of the integer values in the group of data blocks may further refine the subset of compression techniques to a particular compression technique, such as the case where a distribution showing a small range of values might indicate the use of a dictionary-based compression technique. Similarly, evaluation of the metadata may be used to determine a different compression technique to be applied to data instead of a user-selected compression technique. Metadata may also indicate that further analysis of the raw data stored in the group of data blocks may also be needed to make a determination of a compression technique to be applied as the primary compression technique. For instance, methods to determine the column-specific compression technique may include analyzing the data to be stored, such as by examining the data for a certain size domain of possible values, or a commonly repeating values.

The compressed data may be compressed according to a secondary compression technique to produce multi-level compressed data, as indicated at 630. This secondary compression technique may be a default compression technique, or other general compression technique, including, but not limited to, run-length compression, Lempel-Ziv, Lempel-Ziv-Oberhumer, bzip, Huffman, or any other byte-oriented or generic compression technique. In some embodiments, block metadata for the data block, such as the superblock data structure 470 described above with regard to FIG. 4, may be updated to identify the secondary compression technique as well as the primary compression technique applied.

The multi-level compressed data may then be stored in the data block, as indicated at 640. Storing data in storage, such as the disks described above with regard to FIGS. 3 and 4, or storage 530 described above with regard to FIG. 5, may, in some embodiments, be performed to store the multi-level compressed data in new data block, or add the multi-level compressed data to an existing data block. For example, in various embodiments when multi-level compressed data, data compressed according to the second compression technique, or raw data is to be stored in storage, a new data block may be created in storage with the data then written to it. If, however, the multi-level compressed data, data compressed according to the second compression technique, or raw data is to be added to a partially filled data block already storing data, then a new data block may be created and the already stored data may be written to the new block along with the new data to be stored. In some embodiments, this already stored data may be multi-level compressed data, in which case it may be decompressed and then compressed together with the new data to be stored, before storing it in the new data block.

Figure 7:
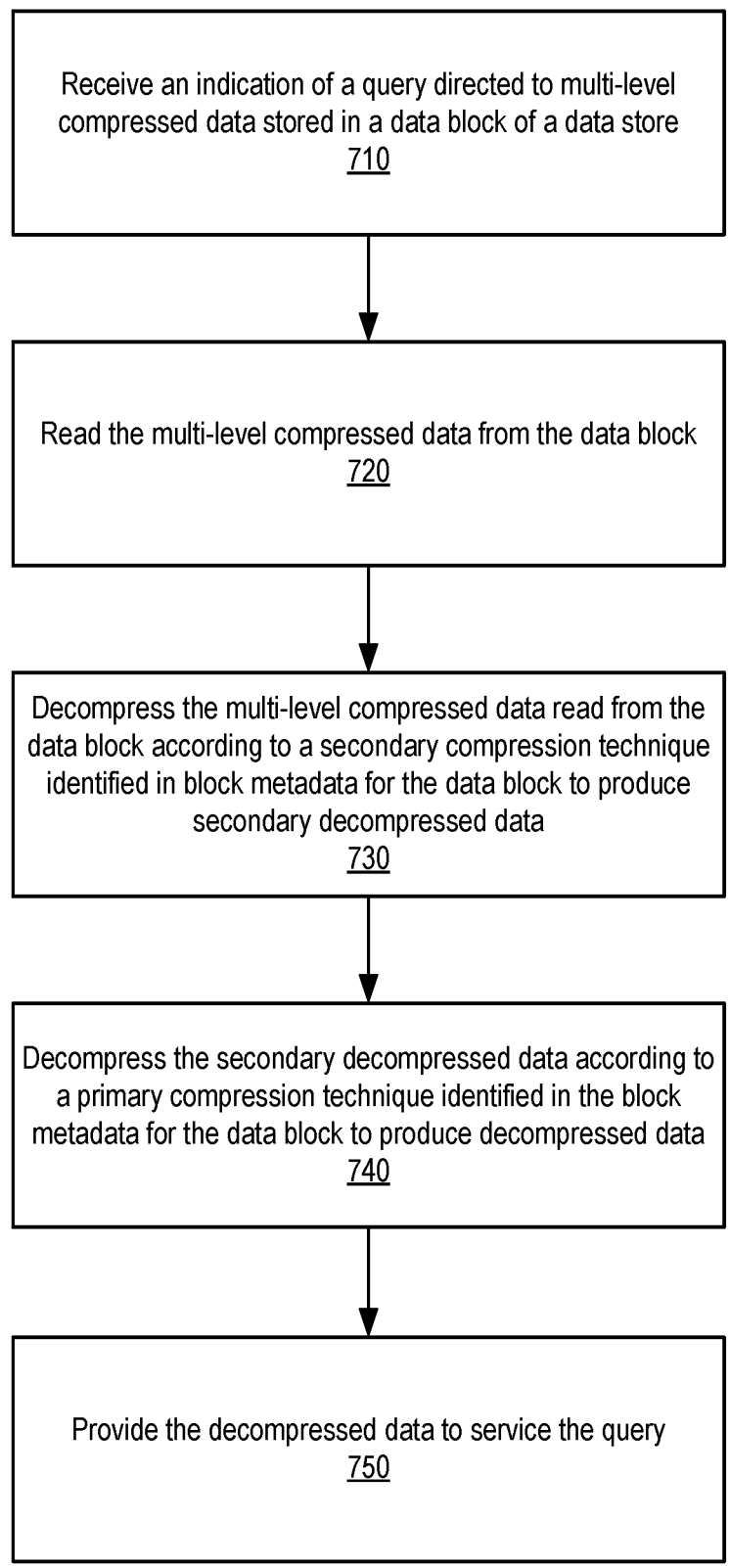
FIG. 7 is a high-level flowchart illustrating a method to process queries for data in a data store compressed according to a multi-level compression scheme, according to some embodiments.

As discussed above, queries for select data may be received, and the multi-level compressed data may be read and decompressed in order to service these queries. FIG. 7 is a high-level flowchart illustrating a method to process queries for data in a data store compressed according to a multi-level compression scheme, according to some embodiments. A query engine, such as query engine 520 described above with regard to FIG. 5, or any other combination of modules or devices may be configured to implement the following methods and techniques.

A query, or an indication of a query, directed to a data store, such as a column of a columnar database table, may be received, as indicated at 710. For instance, a leader node may receive a query for select data from a storage client. The leader node may develop a query plan and send instructions to query engines residing on different nodes of a distributed data warehouse cluster to perform certain actions in response to the query.

In response to receiving the query, or indication of the query, multi-level compressed data from a data block storing data for the data store may be read, as indicated at 720. In at least some embodiments, the compressed size of the multi-level compressed data may be calculated and stored in block metadata for the data block, such as block metadata 528 discussed above with regard to FIG. 5. As block metadata may indicate the size of the multi-level compressed data stored in the data block, the amount of data read from the data block may equal or be obtained according to the compressed size, in order to prevent reading unnecessary data.

The multi-level compressed data read from the data block may be decompressed according to the secondary compression technique identified as applied to the data block in the block metadata storage for the data block to produce secondary decompressed data, as indicated at 730. Similarly, the default decompressed data may be decompressed according to a primary compression technique identified as applied to the data in the block metadata for the data block to produce decompressed data, as indicated at 740. The decompressed data may then be provided to service the query, as indicated at 750.

In some embodiments, the block metadata for a data block in the data store may also store information about the primary compression technique applied that indicates which data values may be stored in a data block. In response to receiving a query for select data, the block metadata may be examined to determine that the select data is not stored in the multi-level compressed data stored in the data block based on the block metadata. For example, a dictionary-based compression technique may be applied and the index of values used in the dictionary-based compression technique may be stored in the block metadata. In response to a query for select data, the index may be examined to determine whether or not the select data values are stored in the multi-level compressed data.

Example System

Embodiments of compressing data to be stored in a columnar database table according to a multi-level compression scheme as described herein may be executed on one or more computer systems, which may interact with various other devices. One such computer system is illustrated by FIG. 8. In different embodiments, computer system 1000 may be any of various types of devices, including, but not limited to, a personal computer system, desktop computer, laptop, notebook, or netbook computer, mainframe computer system, handheld computer, workstation, network computer, a camera, a set top box, a mobile device, a consumer device, video game console, handheld video game device, application server, storage device, a peripheral device such as a switch, modem, router, or in general any type of computing or electronic device.

In the illustrated embodiment, computer system 1000 includes one or more processors 1010 coupled to a system memory 1020 via an input/output (I/O) interface 1030. Computer system 1000 further includes a network interface 1040 coupled to I/O interface 1030, and one or more input/output devices 1050, such as cursor control device 1060, keyboard 1070, and display(s) 1080. Display(s) 1080 may include standard computer monitor(s) and/or other display systems, technologies or devices. In at least some implementations, the input/output devices 1050 may also include a touch- or multi-touch enabled device such as a pad or tablet via which a user enters input via a stylus-type device and/or one or more digits. In some embodiments, it is contemplated that embodiments may be implemented using a single instance of computer system 1000, while in other embodiments multiple such systems, or multiple nodes making up computer system 1000, may be configured to host different portions or instances of embodiments. For example, in one embodiment some elements may be implemented via one or more nodes of computer system 1000 that are distinct from those nodes implementing other elements.

In various embodiments, computer system 1000 may be a uniprocessor system including one processor 1010, or a multiprocessor system including several processors 1010 (e.g., two, four, eight, or another suitable number). Processors 1010 may be any suitable processor capable of executing instructions. For example, in various embodiments, processors 1010 may be general-purpose or embedded processors implementing any of a variety of instruction set architectures (ISAs), such as the x86, PowerPC, SPARC, or MIPS ISAs, or any other suitable ISA. In multiprocessor systems, each of processors 1010 may commonly, but not necessarily, implement the same ISA.

In some embodiments, at least one processor 1010 may be a graphics processing unit. A graphics processing unit or GPU may be considered a dedicated graphics-rendering device for a personal computer, workstation, game console or other computing or electronic device. Modern GPUs may be very efficient at manipulating and displaying computer graphics, and their highly parallel structure may make them more effective than typical CPUs for a range of complex graphical algorithms. For example, a graphics processor may implement a number of graphics primitive operations in a way that makes executing them much faster than drawing directly to the screen with a host central processing unit (CPU). In various embodiments, graphics rendering may, at least in part, be implemented by program instructions configured for execution on one of, or parallel execution on two or more of, such GPUs. The GPU(s) may implement one or more application programmer interfaces (APIs) that permit programmers to invoke the functionality of the GPU(s). Suitable GPUs may be commercially available from vendors such as NVIDIA Corporation, ATI Technologies (AMD), and others.

System memory 1020 may be configured to store program instructions and/or data accessible by processor 1010. In various embodiments, system memory 1020 may be implemented using any suitable memory technology, such as static random access memory (SRAM), synchronous dynamic RAM (SDRAM), nonvolatile/Flash-type memory, or any other type of memory. In the illustrated embodiment, program instructions and data implementing desired functions, such as those described above for scaling computing clusters in distributed systems as described herein are shown stored within system memory 1020 as program instructions 1025 and data storage 1035, respectively. In other embodiments, program instructions and/or data may be received, sent or stored upon different types of computer-accessible media or on similar media separate from system memory 1020 or computer system 1000. Generally speaking, a computer-accessible medium may include storage media or memory media such as magnetic or optical media, e.g., disk or CD/DVD-ROM coupled to computer system 1000 via I/O interface 1030. Program instructions and data stored via a computer-accessible medium may be transmitted by transmission media or signals such as electrical, electromagnetic, or digital signals, which may be conveyed via a communication medium such as a network and/or a wireless link, such as may be implemented via network interface 1040.

In one embodiment, I/O interface 1030 may be configured to coordinate I/O traffic between processor 1010, system memory 1020, and any peripheral devices in the device, including network interface 1040 or other peripheral interfaces, such as input/output devices 1050. In some embodiments, I/O interface 1030 may perform any necessary protocol, timing or other data transformations to convert data signals from one component (e.g., system memory 1020) into a format suitable for use by another component (e.g., processor 1010). In some embodiments, I/O interface 1030 may include support for devices attached through various types of peripheral buses, such as a variant of the Peripheral Component Interconnect (PCI) bus standard or the Universal Serial Bus (USB) standard, for example. In some embodiments, the function of I/O interface 1030 may be split into two or more separate components, such as a north bridge and a south bridge, for example. In addition, in some embodiments some or all of the functionality of I/O interface 1030, such as an interface to system memory 1020, may be incorporated directly into processor 1010.

Network interface 1040 may be configured to allow data to be exchanged between computer system 1000 and other devices attached to a network, such as other computer systems, or between nodes of computer system 1000. In various embodiments, network interface 1040 may support communication via wired or wireless general data networks, such as any suitable type of Ethernet network, for example; via telecommunications/telephony networks such as analog voice networks or digital fiber communications networks; via storage area networks such as Fibre Channel SANs, or via any other suitable type of network and/or protocol.

Input/output devices 1050 may, in some embodiments, include one or more display terminals, keyboards, keypads, touchpads, scanning devices, voice or optical recognition devices, or any other devices suitable for entering or retrieving data by one or more computer system 1000. Multiple input/output devices 1050 may be present in computer system 1000 or may be distributed on various nodes of computer system 1000. In some embodiments, similar input/output devices may be separate from computer system 1000 and may interact with one or more nodes of computer system 1000 through a wired or wireless connection, such as over network interface 1040.

Figure 8:
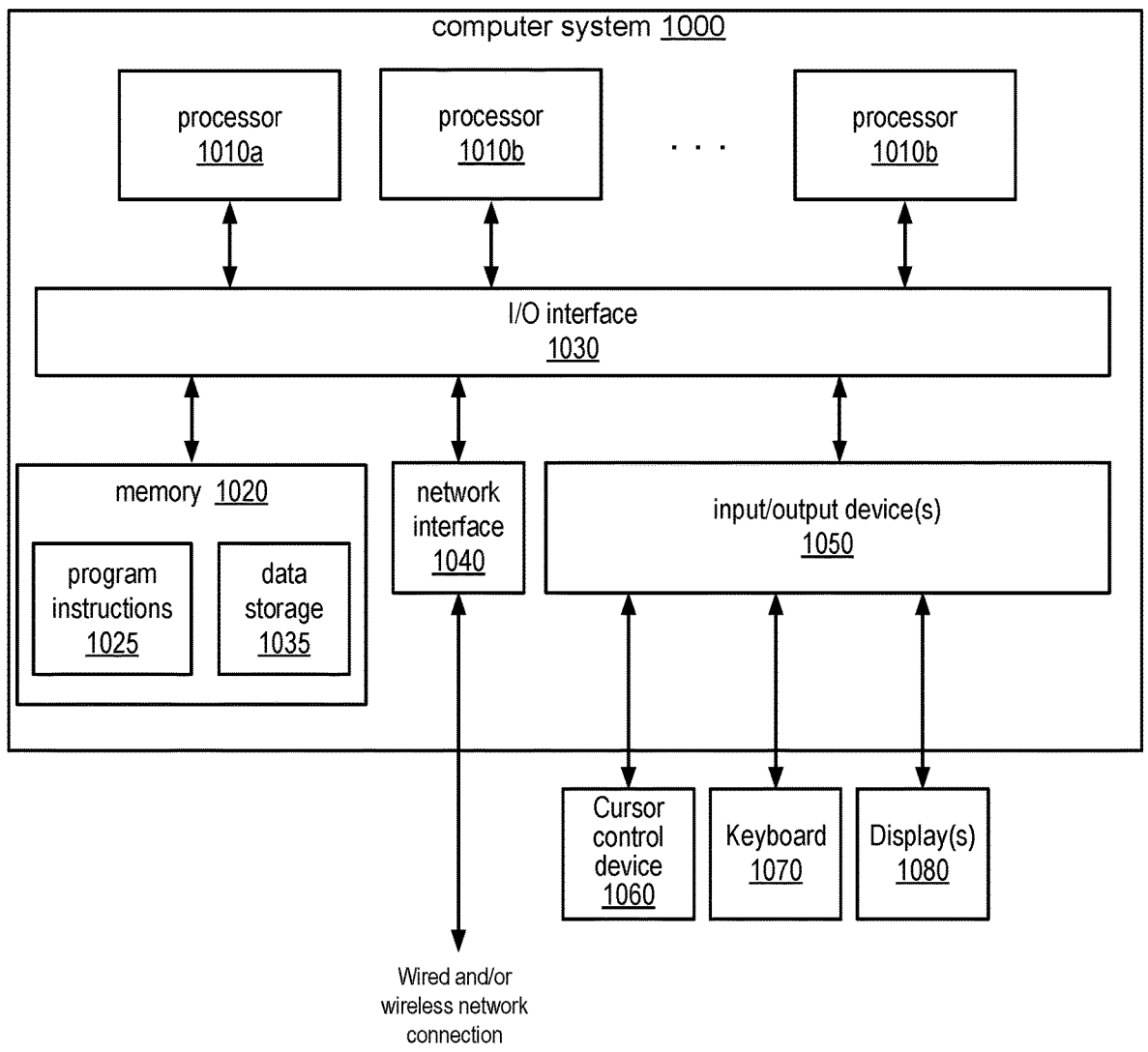
FIG. 8 illustrates an example system, according to some embodiments.

As shown in FIG. 8, memory 1020 may include program instructions 1025, configured to provide time-based item recommendations for a scheduled delivery orders as described herein, and data storage 1035, comprising various data accessible by program instructions 1025. In one embodiment, program instructions 1025 may include software elements of embodiments as described herein and as illustrated in the Figures. Data storage 1035 may include data that may be used in embodiments. In other embodiments, other or different software elements and data may be included.

Those skilled in the art will appreciate that computer system 1000 is merely illustrative and is not intended to limit the scope of the stereo drawing techniques as described herein. In particular, the computer system and devices may include any combination of hardware or software that can perform the indicated functions, including a computer, personal computer system, desktop computer, laptop, notebook, or netbook computer, mainframe computer system, handheld computer, workstation, network computer, a camera, a set top box, a mobile device, network device, internet appliance, PDA, wireless phones, pagers, a consumer device, video game console, handheld video game device, application server, storage device, a peripheral device such as a switch, modem, router, or in general any type of computing or electronic device. Computer system 1000 may also be connected to other devices that are not illustrated, or instead may operate as a stand-alone system. In addition, the functionality provided by the illustrated components may in some embodiments be combined in fewer components or distributed in additional components. Similarly, in some embodiments, the functionality of some of the illustrated components may not be provided and/or other additional functionality may be available.

Those skilled in the art will also appreciate that, while various items are illustrated as being stored in memory or on storage while being used, these items or portions of them may be transferred between memory and other storage devices for purposes of memory management and data integrity. Alternatively, in other embodiments some or all of the software components may execute in memory on another device and communicate with the illustrated computer system via inter-computer communication. Some or all of the system components or data structures may also be stored (e.g., as instructions or structured data) on a computer-accessible medium or a portable article to be read by an appropriate drive, various examples of which are described above. In some embodiments, instructions stored on a computer-readable medium separate from computer system 1000 may be transmitted to computer system 1000 via transmission media or signals such as electrical, electromagnetic, or digital signals, conveyed via a communication medium such as a network and/or a wireless link. This computer readable storage medium may be non-transitory. Various embodiments may further include receiving, sending or storing instructions and/or data implemented in accordance with the foregoing description upon a computer-accessible medium. Accordingly, the present invention may be practiced with other computer system configurations.

It is noted that any of the distributed system embodiments described herein, or any of their components, may be implemented as one or more web services. For example, leader nodes within a data warehouse system may present data storage services and/or database services to clients as web services. In some embodiments, a web service may be implemented by a software and/or hardware system designed to support interoperable machine-to-machine interaction over a network. A web service may have an interface described in a machine-processable format, such as the Web Services Description Language (WSDL). Other systems may interact with the web service in a manner prescribed by the description of the web service's interface. For example, the web service may define various operations that other systems may invoke, and may define a particular application programming interface (API) to which other systems may be expected to conform when requesting the various operations.

In various embodiments, a web service may be requested or invoked through the use of a message that includes parameters and/or data associated with the web services request. Such a message may be formatted according to a particular markup language such as Extensible Markup Language (XML), and/or may be encapsulated using a protocol such as Simple Object Access Protocol (SOAP). To perform a web services request, a web services client may assemble a message including the request and convey the message to an addressable endpoint (e.g., a Uniform Resource Locator (URL)) corresponding to the web service, using an Internet-based application layer transfer protocol such as Hypertext Transfer Protocol (HTTP).

In some embodiments, web services may be implemented using Representational State Transfer ("RESTful") techniques rather than message-based techniques. For example, a web service implemented according to a RESTful technique may be invoked through parameters included within an HTTP method such as PUT, GET, or DELETE, rather than encapsulated within a SOAP message.

CONCLUSION

Various embodiments may further include receiving, sending or storing instructions and/or data implemented in accordance with the foregoing description upon a computer-accessible medium. Generally speaking, a computer-accessible medium may include storage media or memory media such as magnetic or optical media, e.g., disk or DVD/CD-ROM, non-volatile media such as RAM (e.g. SDRAM, DDR, RDRAM, SRAM, etc.), ROM, etc., as well as transmission media or signals such as electrical, electromagnetic, or digital signals, conveyed via a communication medium such as network and/or a wireless link.

The various methods as illustrated in the Figures and described herein represent example embodiments of methods. The methods may be implemented in software, hardware, or a combination thereof. The order of method may be changed, and various elements may be added, reordered, combined, omitted, modified, etc.

Various modifications and changes may be made as would be obvious to a person skilled in the art having the benefit of this disclosure. It is intended that the invention embrace all such modifications and changes and, accordingly, the above description to be regarded in an illustrative rather than a restrictive sense.

What is claimed is:

1. A system, comprising:
   one or more computing devices comprising one or more hardware processors, the one or more computing devices configured to implement a plurality of nodes, wherein one or more of the nodes comprise program instructions that are executed by the one or more hardware processors to implement:
   a read module;
   a query engine to, in response to receipt of an indication of a query:
      determine an amount of multi-level compressed data to be read from a stored portion of the multi-level compressed data, compressed in accordance with primary and secondary compression techniques, according to a compressed size of multi-level compressed data stored in the stored portion of data, wherein the compressed size is indicated by metadata for the stored portion of data, and
      direct the read module to read the determined amount of multi-level compressed data from the stored portion;
   a secondary decompression engine to decompress the read multi-level compressed data according to the secondary compression technique;
   a primary decompression engine to decompress the secondary decompressed data according to the primary compression technique to produce decompressed data; and
   a query engine to provide the decompressed data to service the query.

2. The system of claim 1, further comprising program instructions that are executed by the one or more hardware processors to implement a write module to:
   calculate compressed sizes of multi-level data stored in portions of data; and
   update the metadata for the portions of data to indicate the compressed sizes of the multi-level compressed data stored in the portions of the data.

3. The system of claim 2, further comprising program instructions that are executed by the one or more hardware processors to cause the write module to update metadata for the stored portion of data to identify the primary compression technique applied to the data to be stored in the stored portion of data and the secondary compression technique applied to the compressed data.

4. The system of claim 1, wherein:
   the secondary decompression engine comprises a system decompression engine and the secondary compression technique comprises a system compression technique,
   program instructions are executed by the one or more hardware processors to cause the system decompression engine to perform said decompress the multi-level compressed data according to a system compression technique that is different from the primary compression technique upon reading the multi-level compressed data from the portions of data in storage,
   the read module comprises the system decompression engine, and
   program instructions are executed by the one or more hardware processors to cause the read module to automatically direct the system decompression engine to perform said decompress the read multi-level compressed data according to the system compression technique upon the multi-level compressed data being read from the stored portion of data in storage.

5. The system of claim 4, further comprising program instructions that are executed by the one or more hardware processors to identify the system compression technique based on the metadata for the stored portion.

6. The system of claim 1, further comprising program instructions that are executed by one or more hardware processors to implement a compression selector to:
   receive an indication of a user-selected compression technique; and
   select a column-specific compression engine capable of performing the user-selected compression technique as the primary compression engine from a plurality of available compression engines.

7. The system of claim 1, wherein:
the one or more of the nodes of the plurality of nodes are one or more compute nodes of a data warehouse cluster,
a different node of the plurality of nodes is a leader node of the data warehouse cluster, and
the leader node is to send one or more queries directed to the one or more compute nodes.

8. A method, comprising:
performing, by one or computing devices:
receiving an indication of a query directed to multi-level compressed data, compressed in accordance with primary and secondary compression techniques, and stored in a stored portion of data, wherein a compressed size of the multi-level compressed data stored in the stored portion of the data is indicated in metadata for the stored portion of the data;
subsequent to receiving the indication of the query:
determining an amount of multi-level compressed data to be read from the stored portion of the multi-level compressed data according to the compressed size of the multi-level compressed data indicated in the metadata, and
reading the determined amount of multi-level compressed data from the stored portion of the data;
decompressing the read multi-level compressed data according to the secondary compression technique;
decompressing the secondary decompressed data according to the primary compression technique to produce decompressed data; and
providing the decompressed data to service the query.

9. The method of claim 8, further comprising:
calculating compressed sizes of multi-level data stored in portions of data; and
updating the metadata for the portions of data to indicate the compressed sizes of the multi-level compressed data stored in the portions of the data.

10. The method of claim 8, the method further comprising:
updating metadata for the stored portions of data to identify:
the primary compression technique applied to the data to be stored in the stored portion of data, and
the secondary compression technique applied to the compressed data.

11. The method of claim 8,
wherein the secondary compression technique comprises a system compression technique; and
where said decompressing the read multi-level compressed data according to the secondary compression technique comprises decompressing the read multi-level compressed data according to a system compression technique that is different from the primary compression technique upon reading the multi-level compressed data from the portions of data in storage,
wherein said decompressing the read multi-level compressed data according to the secondary compression technique comprises automatically directing a system decompression engine to decompress the read multi-level compressed data according to the system compression technique upon the multi-level compressed data being read from the stored portion of data in storage.

12. The method of claim 11, the method further comprising:
identifying the system compression technique based on the metadata for the stored portion.

13. The method of claim 8, the method further comprising:
receiving an indication of a user-selected compression technique; and
selecting a compression engine capable of performing the user-selected compression technique as the primary compression engine from a plurality of available compression engines.

14. A non-transitory, computer-readable storage medium, storing program instructions that when executed by one or more computing devices implement:
receiving an indication of a query directed to multi-level compressed data, compressed in accordance with primary and secondary compression techniques, and stored in a stored portion of data, wherein a compressed size of the multi-level compressed data stored in the stored portion of the data is indicated in metadata for the stored portion of the data;
subsequent to receiving the indication of the query:
determining an amount of multi-level compressed data to be read from the stored portion of the multi-level compressed data according to the compressed size of the multi-level compressed data indicated in the metadata, and
reading the determined amount of multi-level compressed data from the stored portion of the data;
decompressing the read multi-level compressed data according to the secondary compression technique;
decompressing the secondary decompressed data according to the primary compression technique to produce decompressed data; and
providing the decompressed data to service the query.

15. The non-transitory, computer-readable storage medium of claim 14, further comprising program instructions that when executed by the one or more computing devices further implement:
calculating compressed sizes of multi-level data stored in portions of data; and
updating the metadata for the portions of data to indicate the compressed sizes of the multi-level compressed data stored in the portions of the data.

16. The non-transitory, computer-readable storage medium of claim 14, further comprising program instructions that when executed by the one or more computing devices further implement:
updating metadata for the stored portions of data to identify:
the primary compression technique applied to the data to be stored in the stored portion of data, and
the secondary compression technique applied to the compressed data.

17. The non-transitory, computer-readable storage medium of claim 14,
wherein the secondary compression technique comprises a system compression technique; and
where to perform said decompressing the read multi-level compressed data according to the secondary compression technique, program instructions when executed by the one or more computing devices further implement:
decompressing the read multi-level compressed data according to a system compression technique that is different from the primary compression technique upon reading the multi-level compressed data from the portions of data in storage, and automatically directing a system decompression engine to decompress the read multi-level compressed data according to the system compression technique upon the multi-level compressed data being read from the stored portion of data in storage.

18. The non-transitory, computer-readable storage medium of claim 17, further comprising program instructions that when executed by the one or more computing devices further implement:

identifying the system compression technique in the metadata for the stored portion.

19. The non-transitory, computer-readable storage medium of claim 14, further comprising program instructions that when executed by the one or more computing devices further implement:

receiving an indication of a user-selected compression technique; and selecting a column-specific compression engine capable of performing the user-selected compression technique as the primary compression engine from a plurality of available compression engines.

20. The non-transitory, computer-readable storage medium of claim 14, wherein the multi-level compressed data is stored in a columnar database table and one or more of the compression techniques are implemented by one or more column-specific compression engines that apply a column-specific compression technique to data stored in portions of data for that specific column of the columnar database table.

\* \* \* \* \*